United States Patent [19]

Bohn

[11] 4,048,649
[45] Sept. 13, 1977

[54] SUPERINTEGRATED V-GROOVE ISOLATED BIPOLAR AND VMOS TRANSISTORS

[75] Inventor: Richard Bohn, Cleveland, Ohio

[73] Assignee: Transitron Electronic Corporation, Wakefield, Mass.

[21] Appl. No.: 655,638

[22] Filed: Feb. 6, 1976

[51] Int. Cl.$^2$ .................... H01L 27/04; H01L 29/78; H01L 29/72; H01L 29/04

[52] U.S. Cl. ................................ 357/43; 357/23; 357/41; 357/50; 357/55; 357/59; 357/60

[58] Field of Search .................. 357/23, 41, 43, 48, 357/50, 55, 56, 59, 60

[56] References Cited

U.S. PATENT DOCUMENTS

| | | | |
|---|---|---|---|
| 3,500,139 | 3/1970 | Frouin et al. | 357/50 |
| 3,622,812 | 11/1971 | Crawford | 357/43 |
| 3,639,787 | 2/1972 | Lee | 357/43 |
| 3,883,948 | 5/1975 | Allison | 357/50 |
| 3,892,608 | 7/1975 | Kuhn | 357/50 |
| 3,924,265 | 12/1975 | Rodgers | 357/23 |
| 3,956,033 | 5/1976 | Roberson | 357/59 |

OTHER PUBLICATIONS

Sanders et al., IEEE International Electron Dev. Meeting, Technical Digest, (Dec. 1973), pp. 38–40.
Declercg, IEEE IEDM Technical Digest (Dec. 1974), pp. 519–522.
Holmes et al., Electronics Letters, vol. 9, No. 19, Sept. 20, 1973, pp. 457–458 (35714 23).

Primary Examiner—William D. Larkins
Attorney, Agent, or Firm—Wolf, Greenfield & Sacks

[57] ABSTRACT

The invention concerns a semiconductor structure having a compatible mixture of bipolar and unipolar transistors. In that structure a monocrystalline p-type silicon substrate is employed which has its 1-0-0 crystallographic planes at a face on which an n epitaxial layer was grown. The epitaxial layer is divided into electrically isolated parts by V-grooves that extend down through the epitaxial layer and have their apices terminating in the substrate. A thin silicon dioxide film coats the V-grooves and those grooves are filled with polycrystallie silicon. Where it is desired to use the polycrystalline silicon as the insulated gate of a field effect transistor, the polycrystalline silicon is electrically conductive. Bases for bipolar transistors are formed by diffusion of an appropriate impurity into selected areas of the epitaxial layer. The emitters, drains, and sources are formed by diffusion of a different impurity. Each field effect transistor has its drain and source on adjacent parts of the epitaxial layer which are separated by the V-groove in which the gate is situated. The base and emitter of a bipolar transistor may be situated on one isolated part and the collector may be situated on an adjacent part separated by a V-groove having an electrically conductive polycrystalline filler.

3 Claims, 8 Drawing Figures

SUPERINTEGRATED V-GROOVE ISOLATED BIPOLAR AND VMOS TRANSISTORS

This invention relates in general to the manufacture of high density integrated circuits. More particularly, the invention pertains to the fabrication of high density integrated unipolar devices that are compatible because both types of devices have low threshold voltages and both have about the same speed capability.

Metal-oxide-semiconductor transistors of conventional construction are not now compatible with bipolar transistors because of the higher threshold voltage and lower speed involved in the operation of the MOS device. The conventional MOS transistor has a metallic gate electrode of aluminum that is insulated from the semi-conductor by a layer of silicon dioxide which acts as the dielectric of a capacitor. To compensate for inaccuracies in the fabrication of the conventional MOS transistor, the aluminum gate is made to overlap parts of the adjacent source and drain regions. The overlap gives rise to overlap capacitances that reduce the switching speed capability of the MOS device. Elimination of the overlap necessitates accurate alignment of the aluminum electrode over the channel and requires a precision that is difficult to achieve in production because the three masks used for source and drain diffusion, gate dioxide growth, and gate electrode deposition must then be held in near perfect registration. A manufacturing procedure which permits virtually no allowance for misalignment of the masks results in a large increase in manufacturing cost because of the greater skill that must be exercised in the alignment of the masks and the lower yield that is obtained whenever precision procedures are pushed to their outermost limits.

The principal physical difference between a conventional MOS transistor and a silicon-gate transistor is the employment in the silicon-gate device of polycrystalline silicon for the gate electrode instead of the aluminum electrode used in the conventional device. The process employed in the fabrication of the silicon-gate device causes the gate electrode to be self-aligning with the channel and eliminates the overlap that is necessary with the conventional MOS device. Therefore, the switching speed capability of the silicon-gate device is improved by the elimination of the overlap capacitances present in the conventional device. Further, because the work function of the polycrystalline silicon is lower than the work function of the aluminum commonly used in the conventional MOS device, a substantial reduction in threshold voltage is achieved. The low threshold voltage attained with the polycrystalline silicon gate device is of special interest because it makes compatible operation with bipolar devices possible.

The silicon-gate transistor has an additional characteristic that makes it feasible to fabricate silicon-gate devices with bipolar devices on the same chip. In the conventional silicon gate device, the insulative gate dioxide layer is protected by the polycrystalline silicon and dioxide above it. That protection is important where bipolar transistors are produced on the same wafer because the fabrication of bipolar devices requires several high temperature steps.

To achieve greater density of bipolar devices on an integrated circuit chip, a process known as V-ATE has been used to provide air isolation between devices. In the V-ATE process a V-shaped moat is formed around the active device. To keep the moat relatively shallow, the active bipolar devices are formed in a thin epitaxial layer on the substrate. In the V-ATE process, a $p$ type substrate with 1-0-0 crystal orientation is used on which an $n$ epitaxial layer of silicon is grown. A shallow base diffusion follows in which base regions of the transistors and conventional $p$ type resistors are formed. An isolation mask is applied and the moat pattern is etched in the usual protective oxide layer. The V-moat isolation is then achieved by a vertical anisotropic etch that takes place much faster along the 1-0-0 crystal face than along the 1-1-1 face. The anisotropic etch produces a precise V-groove with a 54° angle to the surface. Because the etch slants away from the edge of the mask opening toward its center, the mask opening is not undercut and the maximum width of the moat does not exceed the mask opening width.

THE INVENTION

The invention utilizes an anisotropic etch to isolate active elements with intervening moats. The moat is coated with a layer of dielectric material and the moat is then filled with polycrystalline silicon to make the area topographically flat. The flat topography permits the leads to lie upon a plane surface and thereby avoids the difficulties that occur where leads must cross unfilled moats. The advantage of laying the leads on a planar surface is that more reliable connections are formed upon flat surface than upon a surface where the leads must descend into moats to follow the changing contour of the surface. The polycrystalline silicon in the moat is employed as the gate electrode of one or more silicon gate transistors. The invention thereby enables a high density compatible mixture of unipolar devices and bipolar devices to be fabricated on the same chip. The moat formed by the anisotropic etch is employed as the means for isolating active devices while also serving to accurately position the gate electrode of the silicon gate transistor. That arrangement permits parasitic capacitances to be minimized by forming the source and drain so that they present an edge-on aspect to the nearest part of the gate electrode.

THE DRAWINGS

The invention, both as to its fabrication and its mode of operation, can be better understood from the detailed description which follows when it is considered together with the accompanying drawings in which.

DETAILED DESCRIPTION

Figure 1:
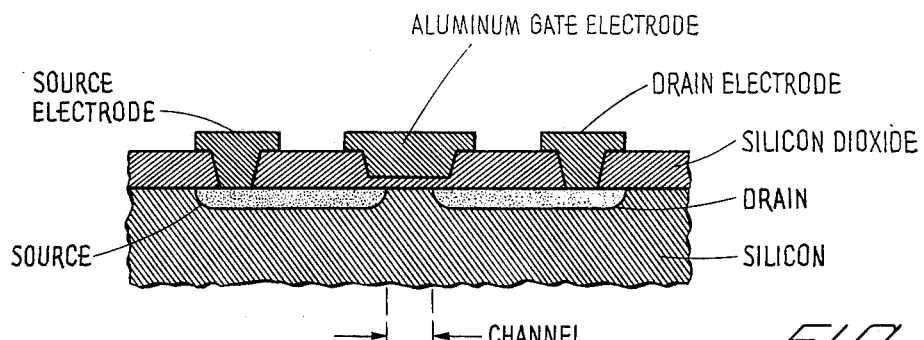
FIG. 1 shows the cross-section of a conventional MOS transistor.

A convention MOS transistor is shown in FIG. 1 having a source and a drain separated by a channel. Disposed over the channel is an aluminum gate electrode that is insulated from the channel by an interposed layer of silicon dioxide which acts as the dielectric of a capacitor formed by the gate electrode and the silicon substrate. The upper surface of the semi-conductor is covered by a layer of silicon dioxide having windows permitting aluminum electrodes to make connections with the source and the drain. The aluminum gate electrode overlaps adjacent regions of the source and the drain. The overlap of the gate electrode is made to insure that the electrode is situated over the channel despite inaccuracies occuring in the process of manufacture which requires the alignment of at least three masks. One of the masks determines the placement of the source and drain regions on the silicon substrate, a second mask is employed in growing the insulative dioxide layer over the channel, and a third mask is used to deposite the aluminum electrode on the insulative layer. To insure that the gate electrode is situated over the channel despite inaccuracies caused by misalignment of the masks, the gate electrode is made wider than the channel and consequently overlaps areas of the source and drain. The overlap creates unwanted capacitances between the gate electrode and the source which slow down the switching action of the transistor. While those capacitances can be reduced by elimination or reduction of the overlap, the precision required for the alignment of the mask is not attainable in production methods without an inordinate increase in the cost of fabrication. In addition, the trend toward higher density of devices on a chip aggravates the problem of accurate mask registration because less area on the chip is available for each device where the density of the devices is materially increased. The need for extreme accuracy in the alignment of masks, therefore, tends to work against the attainment of higher densities.

Figure 2:
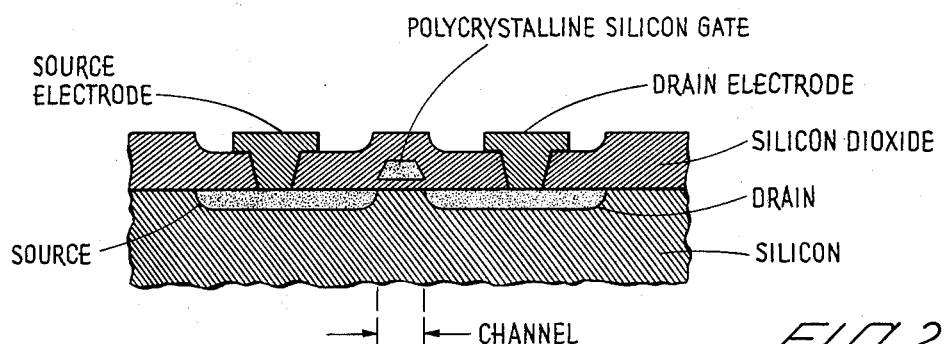
FIG. 2 shows the cross-section of a silicon-gate unipolar transistor.

The alignment problem is less severe in the silicon-gate unipolar transistor depicted in FIG. 2 because the gate electrode tends to be self-aligning with the channel. Fabrication commences with the formation of a layer of silicon dioxide on the $n$ type silicon substrate. Windows are then etched in the silicon dioxide layer by conventional masking and etching techniques. Those windows determine the placement of the MOS transistors on the wafer. A layer of polycrystalline silicon is deposited over the wafer. The polycrystalline silicon layer is then masked and etched to form the gate structure and to simultaneously open windows above the source and drain regions. Inasmuch as the gate structure and the source and drain are located by a single mask, there is no problem of gate misalignment caused by poor registration of different masks. A $p$ type dopant, such as boron, is then diffused into the source and drain regions. The dopant simultaneously diffuses into the polycrystalline gate and causes it to become heavily $p$ doped silicon. Another silicon dioxide layer is then grown which encapsulates the polycrystalline silicon gate. Windows are opened in the dioxide layer for the source and drain contacts and for a contact to the gate. An aluminum metalization layer is then deposited over the entire surface and by conventional masking and etching, leads are formed.

It should be observed that the polycrystalline silicon gate is disposed upon a dioxide layer grown in the first silicon dioxide deposition. The polycrystalline silicon gate protects the underlying silicon dioxide from etches occurring after the gate is initially formed and consequently this type of process results in a self-aligning gate. Because of that self-aligning characteristic, the gate need not overlap regions of the source and drain. The absence of overlap capacitances permits the silicon-gate transistor to operate at higher switching speeds than the conventional MOS transistor.

The work function of the polycrystalline silicon employed in the gate is lower than the work function of the aluminum used in the conventional MOS transistor. Consequently, the silicon-gate device has a lower threshold voltage than the conventional MOS device. The low threshold voltage of the silicon-gate device is of special interest because, in combination with the higher switching speed capability of that device, the silicon-gate transistor can be compatibly operated with bipolar devices. This permits direct inter-connections between bipolar devices and unipolar devices on the same wafer.

The method of fabricating silicon-gate transistors is adaptable to integrated circuitry in which a mixture of unipolar and bipolar devices occurs. The dielectric gate oxide is protected by the layers of polycrystalline silicon and oxide above it. That protection is of advantage where bipolar transistors are being produced on the wafer inasmuch as several high temperature steps are involved in the formation of bipolar transistors.

Figure 3:
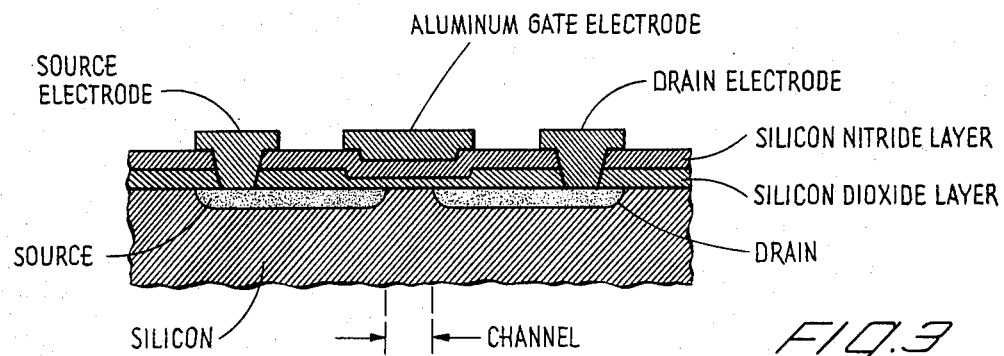
FIG. 3 depicts an MOS transistor employing a silicon nitride dielectric above the channel.

The low threshold voltage necessary to compatibility with bipolar devices can be obtained with an MOS transistor employing a silicon nitride dielectric above the channel of the transistor as depicted in FIG. 3. Because the dielectric constant of silicon nitride is higher than that of silicon dioxide (typically 7.5 compared with 3.9), the silicon nitride dielectric increases the capacitance between the gate electrode and the channel. The higher capacitance lowers the threshold voltage while the silicon nitride layer maintains a sufficient insulation thickness, from a mechanical standpoint, between the aluminum gate electrode and the channel. The silicon nitride layer can be used in combination with a layer of silicon dioxide as the gate dielectric. The use of the two layer dielectric makes fabrication more difficult but increases the reliability of the device because the probability of pinholes lining up in both the nitride and dioxide layer is highly remote. In addition, the use of two layers reduces the hysteresis effect that can occur when only a silicon nitride dielectric is employed.

It should be noted that the FIG. 3 construction does not avoid the problem of mask alignment and hence requires that the aluminum gate electrode overlap the source and drain regions. The switching speed of the device is therefore adversely affected by the overlap capacitances and while the threshold voltage may be compatible with that of a bipolar transistor the switching speed may be much lower than the switching speed capability of the bipolar device.

Figure 4:
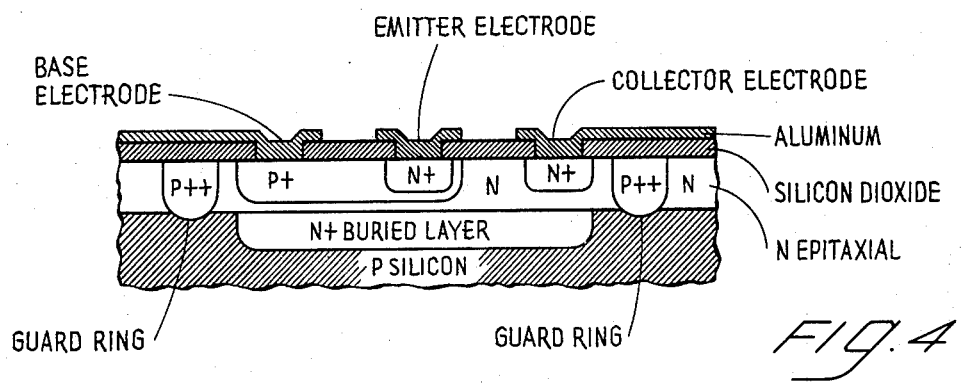
FIG. 4 depicts the cross-section of a conventional bipolar transistor showing its isolation by active $pn$ junctions at the sidewalls.

FIG. 4 shows the conventional technique of isolating active elements on an integrated circuit wafer by forming an isolation ring around the element. As depicted in FIG. 4, the wafer is initially of $p$ type silicon and is processed to provide it with an $n+$ buried layer covered by an epitaxially formed $n$ layer. A base region for the bipolar transistor is made by diffusing a $p$ type dopant into the $n$ epitaxial layer. This is usually done by the conventional process of masking and etching a window to permit the dopant to diffuse into the selected base region. The emitter and collector regions are then formed by diffusing an n type dopant into the n epitaxial layer. Where more than one active element is formed on the semiconductor wafer, it is isolated by forming an isolation ring around the element. Inasmuch as the active element is shown to be an npn transistor, the isolation band is constituted by a guard ring which is heavily doped with a p type dopant. The pn junctions at the interface of the guard ring and the n epitaxial layer form sidewalls that inhibit interaction between adjacent active elements by functioning as active reverse-biased pn junctions. That technique is known as "junction isolation." Unfortunately, the tendency of the isolation rings to diffuse laterally makes it virtually impossible to achieve high packing densities using the junction isolation technique.

In lieu of junction isolation, effective isolation can be attained by surrounding each active element with a moat that separates it from adjacent elements on the substrate. To achieve high packing densities, the moat should be no wider than is necessary to provide the requisite electrical isolation. Consequently, to achieve high densities, processes must be used that make possible the formation of narrow moats.

Figure 5:
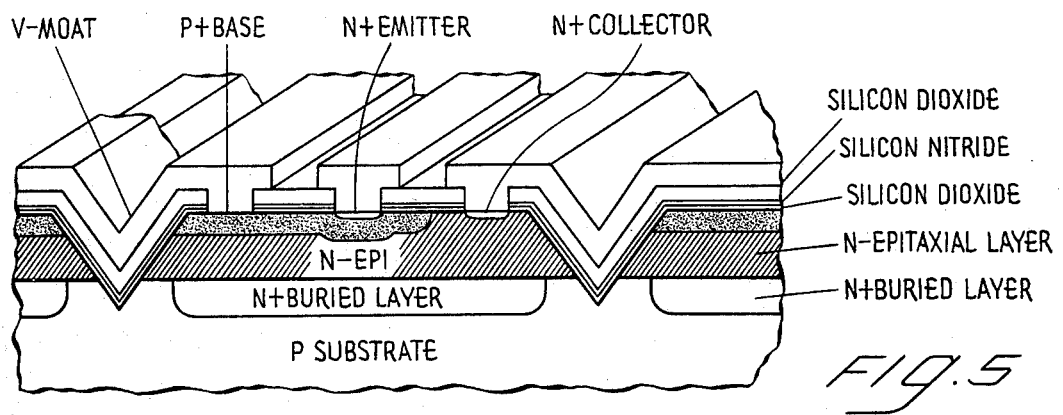
FIG. 5 shows the isolation of active bipolar devices by V-notch moats.

FIG. 5 shows a structure having isolation moats formed by an etching method that does not undercut the mask opening. A p type silicon wafer with 1-0-0 crystal orientation is used which is provided by conventional techniques with a buried n+ layer. The buried layer may, for example, be a slug of antimony that is diffused into the substrate. An n epitaxial thin layer of silicon is grown on the substrate. If high resistance "epi" resistors are to be formed, the n epitaxial layer is grown by using silane rather than silicon tetrachloride. To keep the moats shallow, the n epitaxial layer is not permitted to grow to an appreciable thickness. Assuming that a large number of transistors are to be simultaneously formed on the wafer, the base regions of the transistor are formed by diffusing a p type dopant into selected regions of the epitaxial layer through windows opened in a protective covering of silicon dioxide. A protective oxide mask is then applied over the wafer's surface and the isolation moat pattern is etched in the oxide. The areas on the wafer exposed by openings in the mask are subjected to a vertical anisotropic etch. The etch rate is preferential to the crystal orientation and because the rate is much faster along 1-0-0 crystals face than along the 1-1-1 face, the etch forms a V-groove that extends down and away from the mask opening. The etch does not undercut the mask and consequently, the maximum width of the groove does not exceed the width of the mask opening. The shallower the groove, the narrower the moat. For high packing densities, therefore, it is desirable to have shallow grooves.

After the formation of the V-moats, the silicon dioxide coating is removed from the wafer's surface. A uniform and thin layer of silicon dioxide is formed on the wafer's surface. That layer is covered with a thin coating of silicon nitride and the nitride is covered with a layer of silicon dioxide.

A contact mask is applied and openings for the emitters, collectors, and base contacts are etched down to the silicon nitride layer. The openings for the base contacts are covered with a protective coat and the nitride and silicon dioxide are etched from the remaining contact openings to expose the silicon surface. The emitters and collectors are formed by diffusion through the openings which converts the underlying material to n+ silicon. The base contact openings are then etched to remove the nitride and oxide coats and expose the silicon base. With all the contacts open down to the silicon, metal contacts are formed by conventional metalization techniques.

The moats of the FIG. 5 device are air-filled and as shown in that figure, the metal leads which provide external electrical contacts to the emitter and collector traverse the moats. Because the leads descend into and rise from the moats to follow the changing contour of the surface, the leads introduce a degree of unreliability into the structure. Where the leads bend sharply over the ridges, the leads tend to form unreliable connections. The invention avoids the problem, by providing a planar surface for the leads while using the fill material in the moat as an element of an insulated gate field effect transistor.

Figure 6:
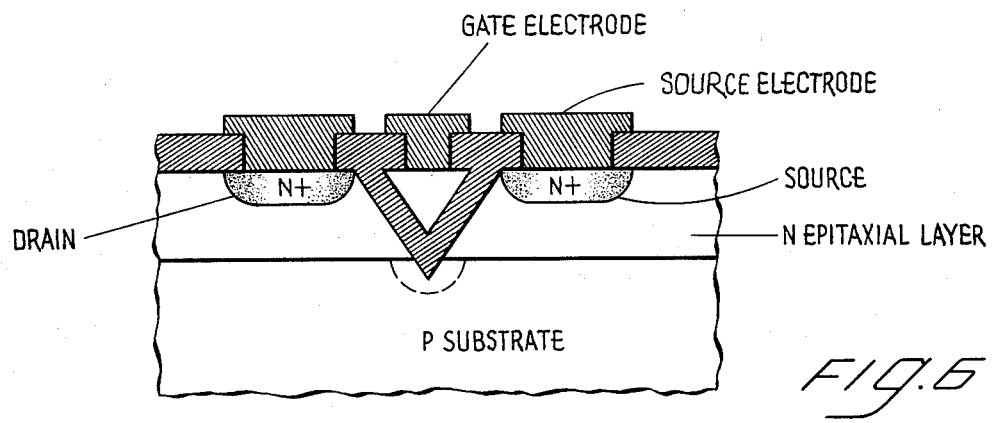
FIG. 6 shows the cross-section of a silicon gate unipolar transistor using the polycrystalline silicon in the V-notch as the gate electrode.

A rudimentary embodiment of the invention is shown in FIG. 6 where a p type silicon substrate having 1-0-0 crystal orientation is employed. A thin n epitaxial layer is grown on the substrate. The wafer is covered with a protective layer of silicon dioxide. The isolation moat pattern is etched in the protective layer to uncover portions of the surface of the wafer. The exposed areas are subjected to a vertical anisotropic etch that forms V-grooves in the silicon wafer. The V-groove extends completely through the epitaxial layer and into the p substrate. Because the width of the V-groove is related to the depth of the groove, it is necessary where high packing densities are desired, to employ a thin epitaxial layer. A thin layer of silicon dioxide is formed upon the inclined faces of the V-groove. That layer acts as the dielectric for the gate electrode of an insulated gate field effect transistor. The moat is filled with polycrystalline silicon that is deposited upon the silicon dioxide film lining the V-groove. By careful control, the polycrystalline silicon can be grown until it overfills the moat. The surface of the wafer is then polished to remove the silicon dioxide layer down to the silicon surface. In doing so, the excess polycrystalline silicon above the moat is removed until a planar surface even with the silicon surface is obtained. A protective layer of silicon dioxide is formed over the wafer's surface. Openings for the drain, the source, and gate electrode are formed in the protective oxide layer. The drain and the source are formed by diffusing an n type dopant into the exposed areas of wafer. Simultaneously the dopant diffuses into the polycrystalline silicon filling in the V-groove and converts that material to a good electrical conductor. Metal contacts to the drain, source, and gate are then formed by conventional metalization techniques. By applying an electrical signal to the gate electrode, the p silicon at the apex of the V-groove is converted to n silicon and forms a channel permitting current to flow between the drain and the source. The device illustrated in FIG. 6 in an n channel insulated gate field effect transistor. It is evident that a p channel device can be fabricated in much the same way by using an n silicon substrate on which a p epitaxial layer is formed and using a p type dopant to form the drain and source regions.

Figure 7:
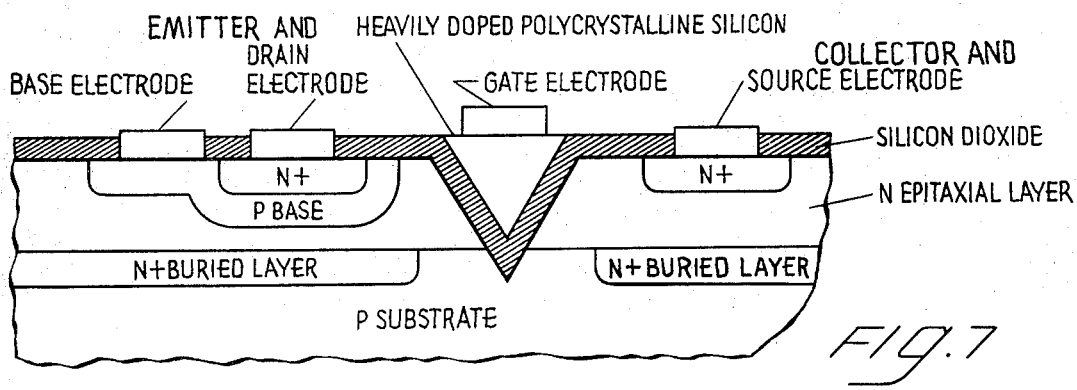
FIG. 7 shows the construction of a bipolar transistor and a unipolar silicon-gate transistor on the same ship.

FIG. 7 depicts an embodiment of the invention having a bipolar transistor and unipolar silicon-gate transistor on the same chip. In constructing the embodiment, a silicon substrate depicted in FIG. 7 is of p type silicon having an n+ buried layer beneath an n epitaxial layer that was grown upon the wafer. The wafer is covered with a protective layer of silicon dioxide. A window is opened in that protective layer and the base region is formed by diffusion of a *p* dopant into the exposed epitaxial layer. The window is then closed by growing a silicon dioxide layer on the wafer. The isolation moat pattern is etched in the silicon dioxide layer and the exposed areas are subjected to an anisotropic etch that forms V-grooves in the silicon wafer to a depth below the *n*-epitaxial layer. The inclined faces of the V-groove are then covered by a thin layer of silicon dioxide which may be in the order of 1000 A thick. The moat is filled with polycrystalline silicon deposited upon the silicon dioxide lining of the V-groove. The polycrystalline silicon may be doped to make the polycrystalline material highly conductive. The surface of the wafer is treated to remove the silicon dioxide layer down to the silicon surface. In that treatment, excess polycrystalline silicon above the moat is also removed so that a planar surface is obtained. A protective layer of silicon dioxide is formed on the wafer in which openings for the drain and source are etched. An *n* type dopant is diffused through those openings to form the drain and source regions. Electrical contacts to the base, drain, source, and gate regions are formed by conventional metalization techniques. Because the V-grooves are filled with polycrystalline silicon, the electrical leads lie upon a planar surface, as is evident from FIG. 7.

Figure 8:
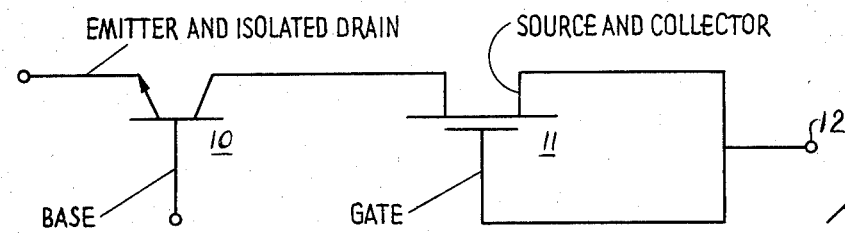
FIG. 8 is an equivalent electric circuit of the structure depicted in FIG. 7.

In the arrangement depicted in FIG. 7 an npn transistor is formed by the drain, base, and source while a field effect transistor is formed by the drain, gate, and source. That arrangement is electrically equivalent to the arrangement depicted in FIG. 8 where npn transistor 10 is shown in series with field effect transistor 11. The field effect transistor acts as a switch for transistor 10. By tying the source and gate together, as shown in FIG. 8, and by connecting them to a source 12 which is at an appropriate electric potential, the arrangement can be used as a resistor.

The bipolar transistor shown in FIG. 7 has its emitter and base situated in a part of the epitaxial layer that is isolated by the V-groove from the part of the epitaxial layer in which the collector is situated. The gate electrode is thereby able to affect the operation of the bipolar transistor by controlling the channel between the two parts of the epitaxial layer. It is evident however that all the elements of the bipolar transistor (viz., the emitter, base, and emitter regions) can be situated on a single part of the epitaxial layer to function in the manner of a conventional bipolar transistor. Consequently, the invention contemplates the construction of a semiconductor structure which has on it a mixture of bipolar and unipolar active elements.

Although only one polycrystalline silicon gate is depicted in FIG. 7, it should be understood that many such gates can be employed on a monolithic chip and that all of those gates can be connected together to permit all the active elements on the chip to be turned off or to be turned on at the same time. Thus the activation or inactivation of an entire chip can be readily controlled. Where it is desired to exercise simultaneous control over less than all the active elements on the chip, only those gates controlling selected active elements need be connected together to provide the requisite control.

Because the invention can be embodied in varied forms, it is not intended that the invention be construed to be limited to the precise forms here illustrated or described.

I claim:

1. A semiconductor structure comprising
   a monocrystalline semiconductor substrate of one conductivity type, the substrate having its <100> crystallographic planes at one face thereof,
   an epitaxial layer of the opposite conductivity type overlying said one face of the substrate,
   a V-groove extending through the epitaxial layer and having its apex in the substrate, the V-groove dividing the epitaxial layer into at least two isolated parts,
   an electrically insulative thin film coating the surfaces of the V-groove,
   electrically conductive polycrystalline semi-conductor material filling the V-groove,
   a first diffusion region of said one conductivity type extending into the epitaxial layer,
   a second diffusion region of said opposite conductivity type overlying a portion of said first region and forming a p-n junction therewith,
   a third diffusion region of said opposite conductivity type extending into the epitaxial layer, said third region being disposed on a part of said epitaxial layer that is isolated by the V-groove from the part of the epitaxial layer on which said first and second regions are situated,
   means on the surface of the semiconductor structure providing electrical connections to each of said diffusion regions and to the polycrystalline material in the V-groove, and
   means for biasing the polycrystalline semiconductor material in the V-groove in a polarity which induces a conductive channel under the V-groove that enables the flow of electric current between isolated parts of the epitaxial layer.

2. The semiconductor structure according to claim 1, wherein the monocrystalline semiconductor substrate has in it a buried layer of said opposite conductivity type adjacent to said epitaxial layer, and the semiconductor material of the substrate in the immediate vicinity of the apex of the V-groove being of said one conductivity type.

3. The semiconductor structure according to claim 1, wherein
   the surface of the semiconductor structure is planar and is covered by an electrically insulative layer having windows therein permitting electrical connections to each of said diffusion regions.

* * * * *